(12) United States Patent
Sakamoto et al.

(10) Patent No.: US 11,886,002 B2
(45) Date of Patent: Jan. 30, 2024

(54) OPTICAL MULTIPLEXING CIRCUIT AND LIGHT SOURCE

(71) Applicant: Nippon Telegraph and Telephone Corporation, Tokyo (JP)

(72) Inventors: Junji Sakamoto, Musashino (JP); Toshikazu Hashimoto, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 305 days.

(21) Appl. No.: 17/438,848

(22) PCT Filed: Apr. 16, 2019

(86) PCT No.: PCT/JP2019/016365
§ 371 (c)(1),
(2) Date: Sep. 13, 2021

(87) PCT Pub. No.: WO2020/213067
PCT Pub. Date: Oct. 22, 2020

(65) Prior Publication Data
US 2022/0155520 A1  May 19, 2022

(51) Int. Cl.
*G02B 6/12* (2006.01)
*G02B 6/125* (2006.01)
*H01S 5/026* (2006.01)

(52) U.S. Cl.
CPC ......... *G02B 6/12007* (2013.01); *G02B 6/125* (2013.01); *H01S 5/0264* (2013.01)

(58) Field of Classification Search
CPC .................................................. G02B 6/12007
See application file for complete search history.

(56) References Cited

U.S. PATENT DOCUMENTS

2018/0128979 A1* 5/2018 Heanue .............. G02B 6/12026

OTHER PUBLICATIONS

Akira Nakao et al., Integrated Waveguide-Type Red-Green-Blue Beam Combiners for Compact Projection-Type Displays, *Optics Communications*, vol. 330, 2014, pp. 45-48.
(Continued)

*Primary Examiner* — Sung H Pak
(74) *Attorney, Agent, or Firm* — Workman Nydegger

(57) ABSTRACT

An optical multiplexing circuit capable of accurately monitoring light of a plurality of wavelengths is provided. An optical multiplexing circuit includes a plurality of branching units configured to each divide light output from a corresponding one of a plurality of input waveguides, a multiplexing unit configured to multiplex a plurality of first beams of the light, each obtained by dividing the light by a corresponding one of the plurality of branching units, an output waveguide configured to output the light multiplexed by the multiplexing unit, a plurality of monitoring multiplexing units that are optical circuits identical to the multiplexing unit, a plurality of first monitoring waveguides configured to output a plurality of second beams of the light, each obtained by dividing the light by a corresponding one of the plurality of branching units, to corresponding ones of the plurality of monitoring multiplexing units, and a plurality of second monitoring waveguides configured to each output an output of a corresponding one of the plurality of monitoring multiplexing units.

7 Claims, 13 Drawing Sheets

(56) References Cited

OTHER PUBLICATIONS

Yoshinori Hibino, *An Array of Photonic Filtering Advantages: Arrayed-Waveguide-Grating Multi/Demultiplexers for Photonic Networks*, IEEE Circuits & Devices, vol. 16, No. 6, 2000, pp. 21-27.
Akira Himeno et al., *Silica-Based Planar Lightwave Circuits*, IEEE Journal of Selected Topics in Quantum Electronics, vol. 4, No. 6, 1998, pp. 913-924.
J. Sakamoto et al., *High-Efficiency Multiple-Light-Source Red-Green-Blue Power Combiner with Optical Waveguide Mode Coupling Technique*, SPIE OPTO, 2017, vol. 10126, 2017, pp. 1-8.

\* cited by examiner

OPTICAL MULTIPLEXING CIRCUIT AND LIGHT SOURCE

TECHNICAL FIELD

The present invention relates to an optical multiplexing circuit and a light source, and more particularly to an optical multiplexing circuit capable of multiplexing light of a plurality of wavelengths such as three primary colors of light and monitoring the intensity of light of each wavelength, and a light source including the optical multiplexing circuit.

BACKGROUND ART

In recent years, a small light source including laser diodes (LDs) that output light of three primary colors of red light (R), green light (G), and blue light (B) as a light source to be applied to a glasses-type terminal and a small pico projector has been developed. Since LDs have a higher directionality than LEDs, a focus-free projector can be realized. Further, since LDs have a high light emission efficiency and a low power consumption, and also a high color reproducibility, LDs have recently been attracting attention.

FIG. 1 illustrates a typical light source of a projector using LDs. The light source for the projector includes LDs 1 to 3 that output light of a single wavelength of respective colors of R, G, and B, lenses 4 to 6 that collimate the light output from the LDs 1 to 3, and dichroic mirrors 10 to 12 that multiplex the respective light and output the light to a MEMS mirror 16. RGB light combined into a single beam is swept by using the MEMS mirror 16 or the like and is synchronized with modulation of the LDs, and thus a video is projected onto a screen 17. Half mirrors 7 to 9 are respectively inserted between the lenses 4 to 6 and the dichroic mirrors 10 to 12, and white balance is adjusted by monitoring the divided light of each color by using photodiodes (PDs) 13 to 15.

In general, an LD emits light in a longitudinal direction of a resonator; however, because the accuracy when monitoring the rear side is poor, it is common to monitor the front side from which light is emitted (front monitoring). As illustrated in FIG. 1, for use as an RGB light source, bulk optical components such as the LDs 1 to 3, the lenses 4 to 6, the half mirrors 7 to 9, and the dichroic mirrors 10 to 12 need to be combined with a spatial optical system. Furthermore, for monitoring for an adjustment of white balance, since bulk components such as the half mirrors 7 to 9 and the PDs 13 to 15 are needed and the optical system increases in size, there is a problem in that a reduction in the size of the light source is hindered.

On the other hand, an RGB coupler using a planar lightwave circuit (PLC) instead of a spatial optical system with bulk components has been attracting attention (for example, see Non Patent Literature 1). In a PLC, an optical waveguide is produced on a planar substrate such as Si by patterning by photolithography or the like, and reactive ion etching, and a plurality of basic optical circuits (for example, a directional coupler, a Mach-Zehnder interferometer, and the like) are combined, and thus various functions can be realized (for example, see Non Patent Literatures 2 and 3).

FIG. 2 illustrates a basic structure of an RGB coupler using a PLC. An RGB coupler module including LDs 21 to 23 of respective colors of G, B, and R and a PLC-type RGB coupler 20 is illustrated. The RGB coupler 20 includes first to third waveguides 31 to 33 and first and second multiplexers 34 and 35 that multiplex light from two waveguides into a single waveguide. As methods using a multiplexer in an RGB coupler module, there are a method of using symmetrical directional couplers having the same waveguide width, a method of using a Mach-Zehnder interferometer (for example, see Non Patent Literature 1), and a method of using a mode coupler (for example, see Non Patent Literature 4), and the like.

By using a PLC, a spatial optical system using a lens, a dichroic mirror, or the like can be integrated on one chip. Further, since the LD of R and the LD of G have a weaker output than the LD of B, an RRGGB light source in which two LDs of R and two LDs of G are prepared is used. As described in Non Patent Literature 2, by using mode multiplexing, light of the same wavelength can be multiplexed in different modes, and an RRGGB coupler can also be easily realized by using a PLC.

FIG. 3 illustrates a configuration of an RGB coupler using two directional couplers. An RGB coupler 100 using the PLC includes first to third input waveguides 101 to 103, first and second directional couplers 104 and 105, and an output waveguide 106 connected to the second input waveguide 102.

A waveguide length, a waveguide width, and a gap between the waveguides are designed such that the first directional coupler 104 couples light of $\lambda 2$ incident from the first input waveguide 101 to the second input waveguide 102, and couples light of $\lambda 1$ incident from the second input waveguide 102 to the first input waveguide 101 and back to the second input waveguide 102. A waveguide length, a waveguide width, and a gap between the waveguides are designed such that the second directional coupler 105 couples light of $\lambda 3$ incident from the third input waveguide 103 to the second input waveguide 102, and passes light of $\lambda 1$ and $\lambda 2$ coupled to the second input waveguide 102 in the first directional coupler 104.

For example, green light G (wavelength $\lambda 2$) is incident on the first input waveguide 101, blue light B (wavelength $\lambda 1$) is incident on the second input waveguide 102, red light R (wavelength $\lambda 3$) is incident on the third input waveguide 103, and the three colors of light R, G, and B are multiplexed by the first and second directional couplers 104 and 105 and output from the output waveguide 106. Light of 450 nm, light of 520 nm, and light of 638 nm are used as the wavelengths of $\lambda 1$, $\lambda 2$, and $\lambda 3$, respectively.

However, the application of such an RGB coupler to configure a light source including a monitoring function for an adjustment of white balance has not been studied from the viewpoint of size reduction of the light source and accuracy of monitoring.

CITATION LIST

Non Patent Literature

[Non Patent Literature 1] A. Nakao, R. Morimoto, Y. Kato, Y. Kakinoki, K. Ogawa and T. Katsuyama, "Integrated Waveguide-type Red-green-blue Beam Combiners for Compact Projection-type Displays", Optics Communications 320 (2014) 45-48

[Non Patent Literature 2] Y. Hibino, "Arrayed-Waveguide-Grating Multi/Demultiplexers for Photonic Networks," IEEE CIRCUITS & DEVICES, November, 2000, pp. 21-27

[Non Patent Literature 3] A. Himeno, et al., "Silica-based Planar Lightwave Circuits," J. Sel. Top. Q. E., vol. 4, 1998, pp. 913-924

[Non Patent Literature 4] J. Sakamoto et al. "High-efficiency Multiple-light-source Red-green-blue Power Combiner with Optical Waveguide Mode Coupling Technique," Proc. of SPIE Vol. 10126 101260 M-2

SUMMARY OF THE INVENTION

An object of the present invention is to provide an optical multiplexing circuit that includes a multiplexing unit formed of a PLC and can accurately monitor light of a plurality of wavelengths, and a light source including the optical multiplexing circuit.

According to the present invention, in order to achieve such an object, an embodiment of an optical multiplexing circuit includes a plurality of branching units configured to each divide light output from a corresponding one of a plurality of input waveguides, a multiplexing unit configured to multiplex a plurality of first beams of the light, each obtained by dividing the light by a corresponding one of the plurality of branching units, an output waveguide configured to output the light multiplexed by the multiplexing unit, a plurality of monitoring multiplexing units that are optical circuits identical to the multiplexing unit, a plurality of first monitoring waveguides configured to output a plurality of second beams of the light, each obtained by dividing the light by a corresponding one of the plurality of branching units, to corresponding ones of the plurality of monitoring multiplexing units, and a plurality of second monitoring waveguides configured to each output an output of a corresponding one of the plurality of monitoring multiplexing units.

Furthermore, an embodiment of a light source with a monitoring function includes the optical multiplexing circuit, a plurality of laser diodes each optically coupled to a corresponding one of the plurality of input waveguides, and a plurality of photodiodes each optically coupled to a corresponding one of the plurality of second monitoring waveguides.

According to the present invention, light of a plurality of wavelengths is monitored via a plurality of monitoring multiplexing units that are optical circuits identical to a multiplexing unit, and thus each wavelength can be monitored with high accuracy.

DESCRIPTION OF EMBODIMENTS

Hereinafter, embodiments of the present disclosure will be described in detail with reference to the drawings. In the present embodiment, description is given for the case of a method using a directional coupler as a multiplexer, but the present invention is not limited to a multiplexing method. Further, description is given by taking, as an example, an RGB coupler that multiplexes wavelengths of three primary colors of light, but it is needless to say that the present invention can be applied to another optical multiplexing circuit that multiplexes a plurality of wavelengths.

First Embodiment

Example 1

Figure 4:
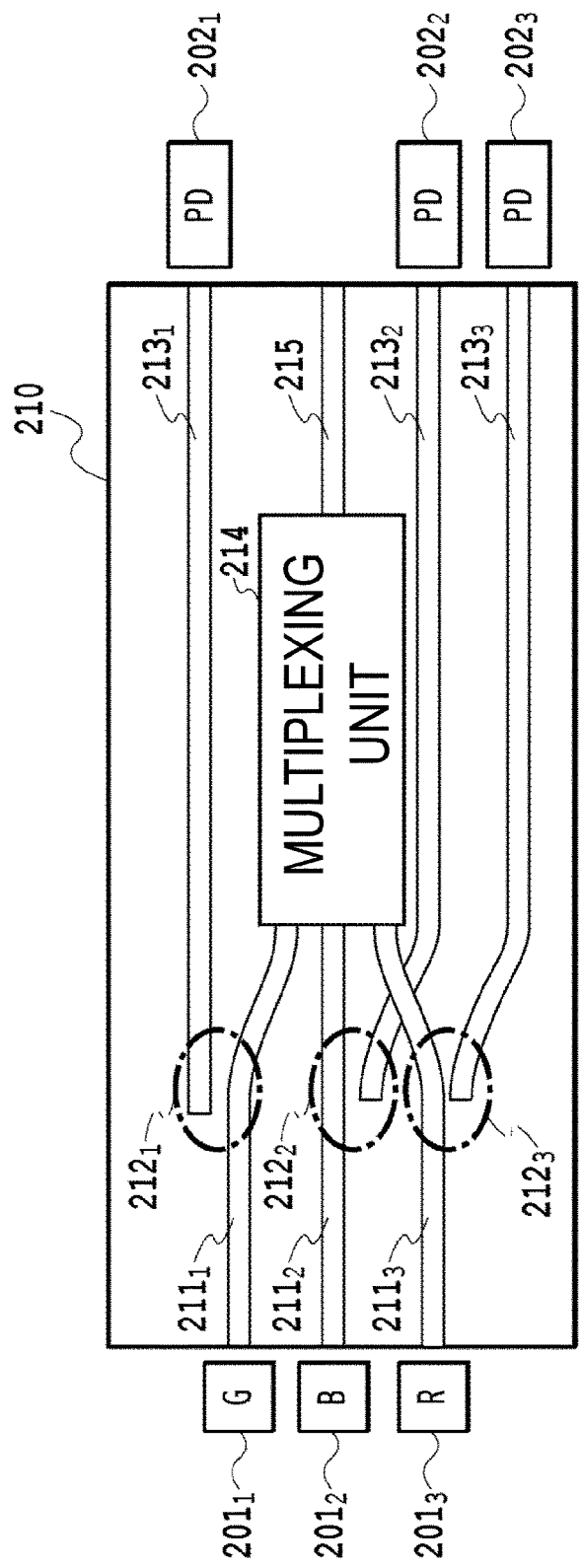
FIG. 4 is a diagram illustrating a light source with a monitoring function according to Example 1 of a first embodiment of the present invention.

FIG. 4 illustrates a light source with a monitoring function according to Example 1 of a first embodiment of the present invention. A light source with a monitoring function includes first to third LDs $201_1$ to $201_3$ that respectively output light of respective colors of G, B, and R, a PLC-type RGB coupler 210, and first to third PDs $202_1$ to $202_3$ optically connected to the RGB coupler 210.

The PLC-type RGB coupler 210 includes first to third input waveguides $211_1$ to $211_3$ optically connected to the first to third LDs $201_1$ to $201_3$, first to third branching units $212_1$ to $212_3$ that divide light propagating through corresponding ones of the waveguides into two, a multiplexing unit 214 that multiplexes a plurality of first beams of the light, each obtained by dividing the light by a corresponding one of the first to third branching units $212_1$ to $212_3$, first to third monitoring waveguides $213_1$ to $213_3$ that output a plurality of second beams of the light, each obtained by dividing the light by a corresponding one of the first to third branching units $212_1$ to $212_3$, to corresponding ones of the first to third PDs $202_1$ to $202_3$, and an output waveguide 215 that outputs the light multiplexed by the multiplexing unit 214.

In the PLC-type RGB coupler 210, light incident on each of the first to third input waveguides $211_1$ to $211_3$ is divided into two by each of the first to third branching units $212_1$ to $212_3$. A plurality of first beams of the divided light are output to corresponding ones of the first to third PDs $202_1$ to $202_3$ via the first to third monitoring waveguides $213_1$ to $213_3$, respectively, and a plurality of second beams of the divided light are multiplexed by the multiplexing unit 214 and output to the output waveguide 215.

Figure 1:
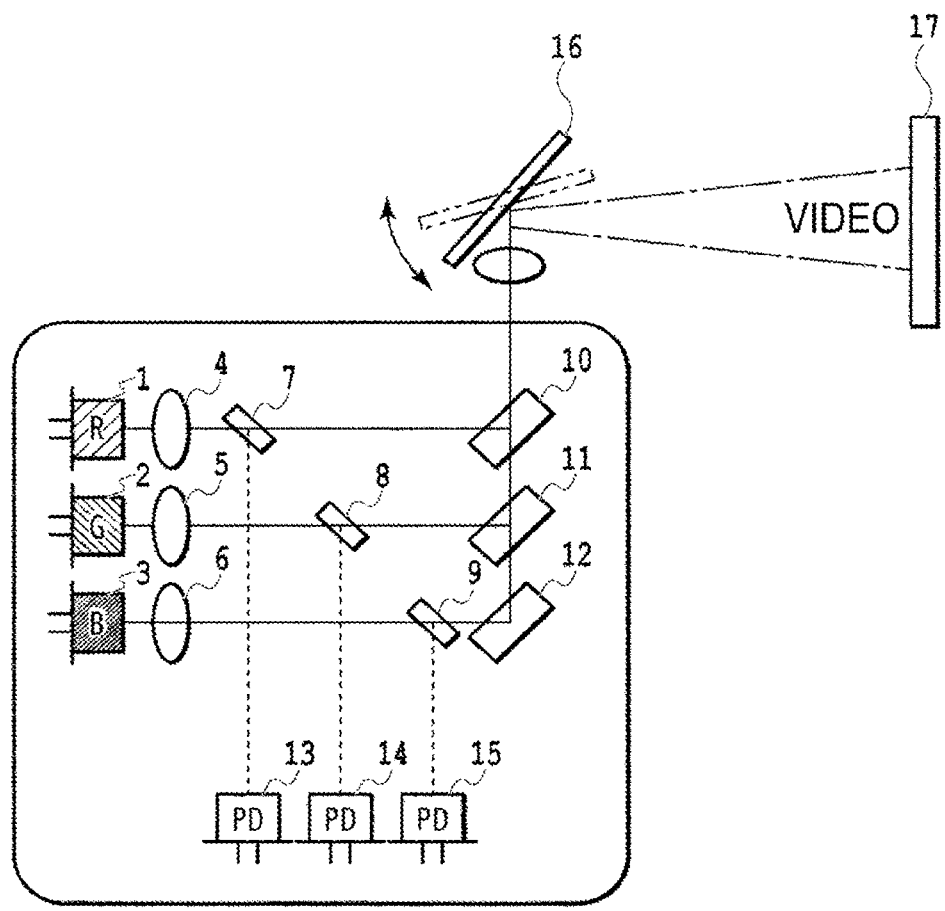
FIG. 1 is a diagram illustrating a typical light source of a projector using an LD.
Figure 2:
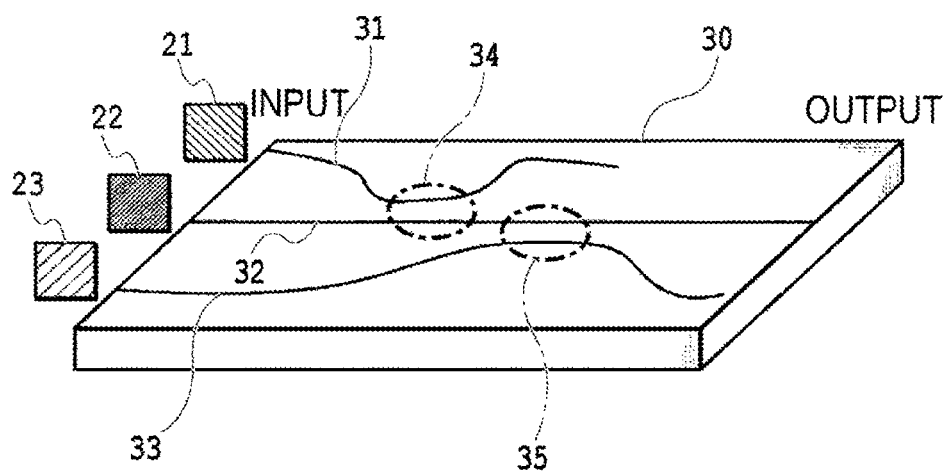
FIG. 2 is a diagram illustrating a basic structure of an RGB coupler using a PLC.
Figure 3:
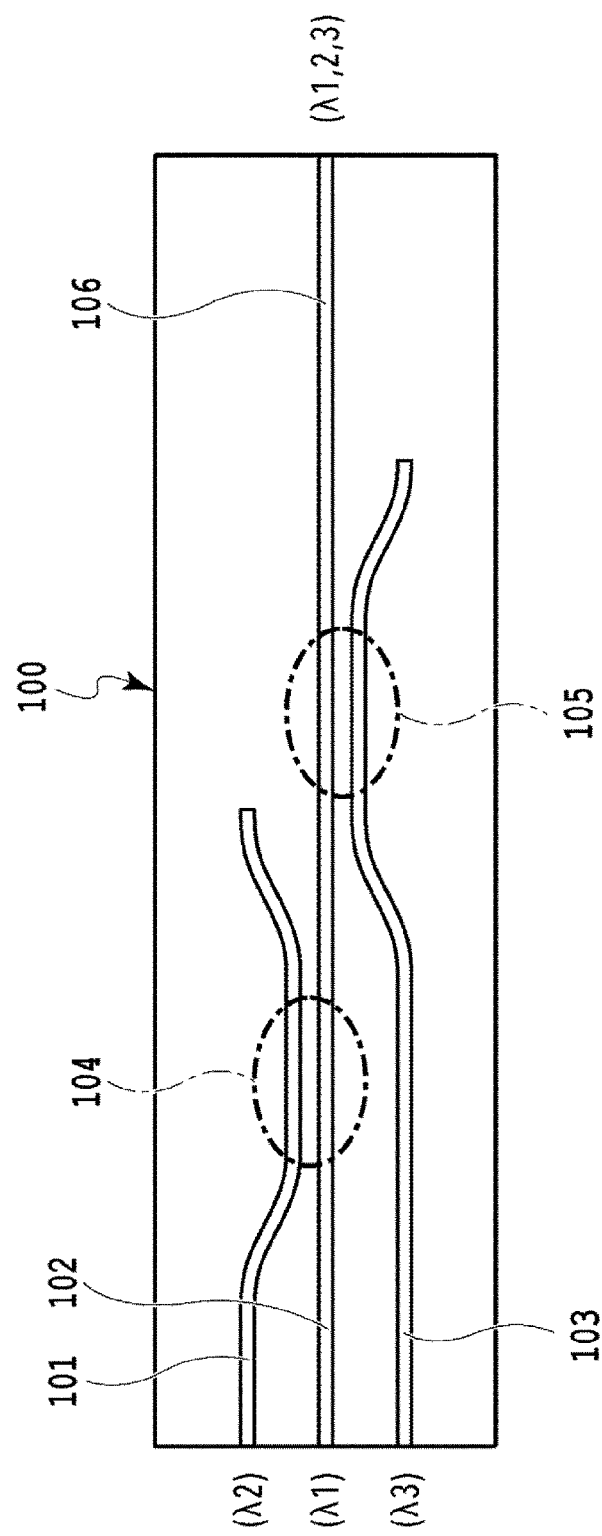
FIG. 3 is a diagram illustrating a configuration of an RGB coupler using two directional couplers.

An optical multiplexing circuit using the directional coupler illustrated in FIG. 3 can be used as the multiplexing unit 214. In this case, the first to third input waveguides $211_1$ to $211_3$ are coupled to the first to third input waveguides 101 to 103 illustrated in FIG. 3, respectively, and the output waveguide 215 is coupled to the output waveguide 106 illustrated in FIG. 3. However, the multiplexing unit 214 is not limited thereto, and another multiplexing unit of a waveguide type (for example, a Mach-Zehnder interferometer, a mode coupler, or the like) may be used.

As illustrated in FIG. 4, when light propagating through the first to third input waveguides $211_1$ to $211_3$ is divided by the first to third branching units $212_1$ to $212_3$, respectively, a coupling characteristic between the first to third LDs $201_1$ to $201_3$ and the first to third input waveguides $211_1$ to $211_3$ can be monitored. In addition, it is possible to adjust white balance as a light source by using a monitoring value of the first to third PDs $202_1$ to $202_3$ by recognizing a multiplexing characteristic of the multiplexing unit 214 in advance.

Example 2

Figure 5:
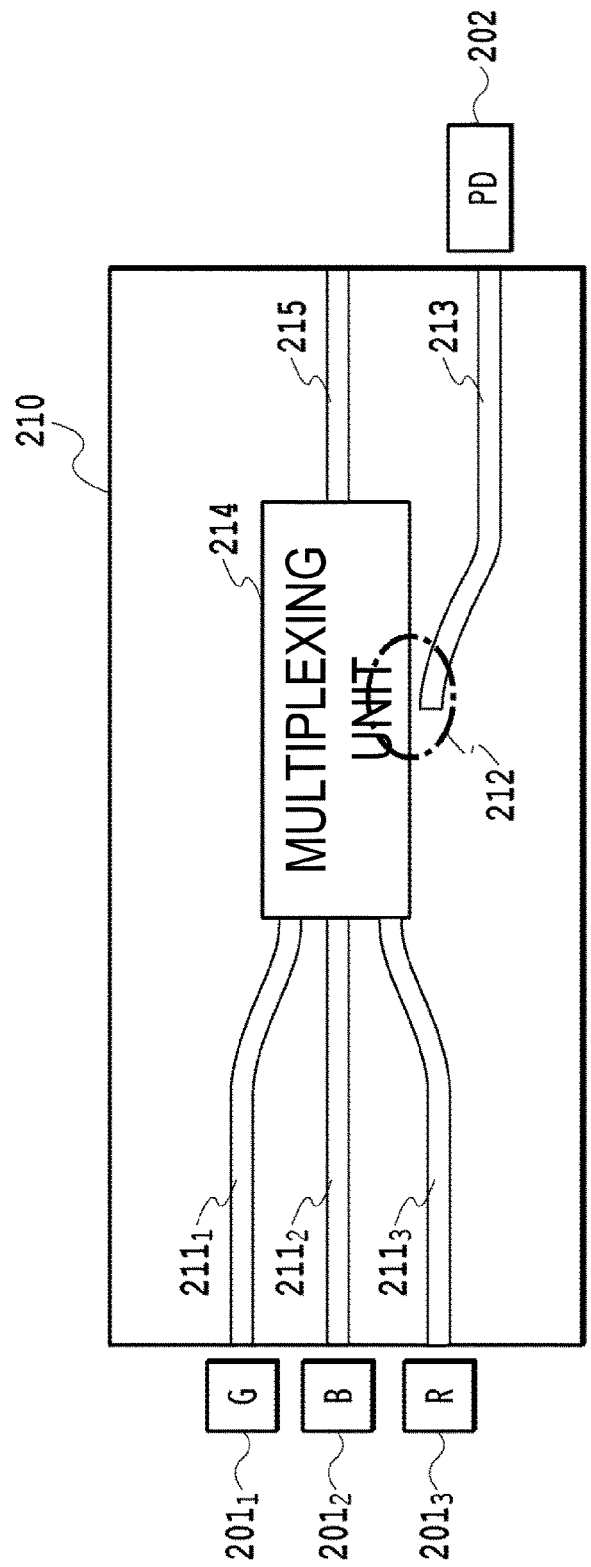
FIG. 5 is a diagram illustrating a light source with a monitoring function according to Example 2 of the first embodiment of the present invention.

FIG. 5 illustrates a light source with a monitoring function according to Example 2 of the first embodiment. A light source 210 with a monitoring function includes first to third LDs $201_1$ to $201_3$ that respectively output light of respective colors of G, B, and R, a PLC-type RGB coupler 210, and a PD 202 optically connected to the RGB coupler 210.

A branching unit 212 is provided near a multiplexing unit 214 in the RGB coupler 210. Light that has not been multiplexed in the multiplexing unit 214 or light leaking is output to the outside of the multiplexing unit 214 via a disposal port. The light that has been disposed of in this manner and has a mixture of colors is divided by the branching unit 212 and input to the PD 202 via a monitoring waveguide 213.

By taking the RGB coupler illustrated in FIG. 3 as an example of the multiplexing unit 214, the second directional coupler 105 being a directional coupler closest to an output side is also used as the branch 212. In other words, the third input waveguide 103 closest to the output side of the input waveguides that are not coupled to an output port is connected to the monitoring waveguide 213 as is and is optically connected to the PD 202. Alternatively, the branching unit 212 may be provided near the second directional coupler 105 being the directional coupler closest to the output side, or near a tip portion of the third input waveguide 103 closest to the output side of the input waveguides that are not coupled to the output port.

In Example 2, since light having a mixture of respective colors of R, G, and B is input to the PD 202 by using the disposal port of the multiplexing unit 214, monitoring can be performed without preparing a circuit for monitoring for each of R, G, and B. Thus, it is possible to realize a smaller light source, and also adjust white balance as a light source by using a monitoring value of the PD 202 by recognizing a multiplexing characteristic of the multiplexing unit 214 in advance.

Example 3

Figure 6:
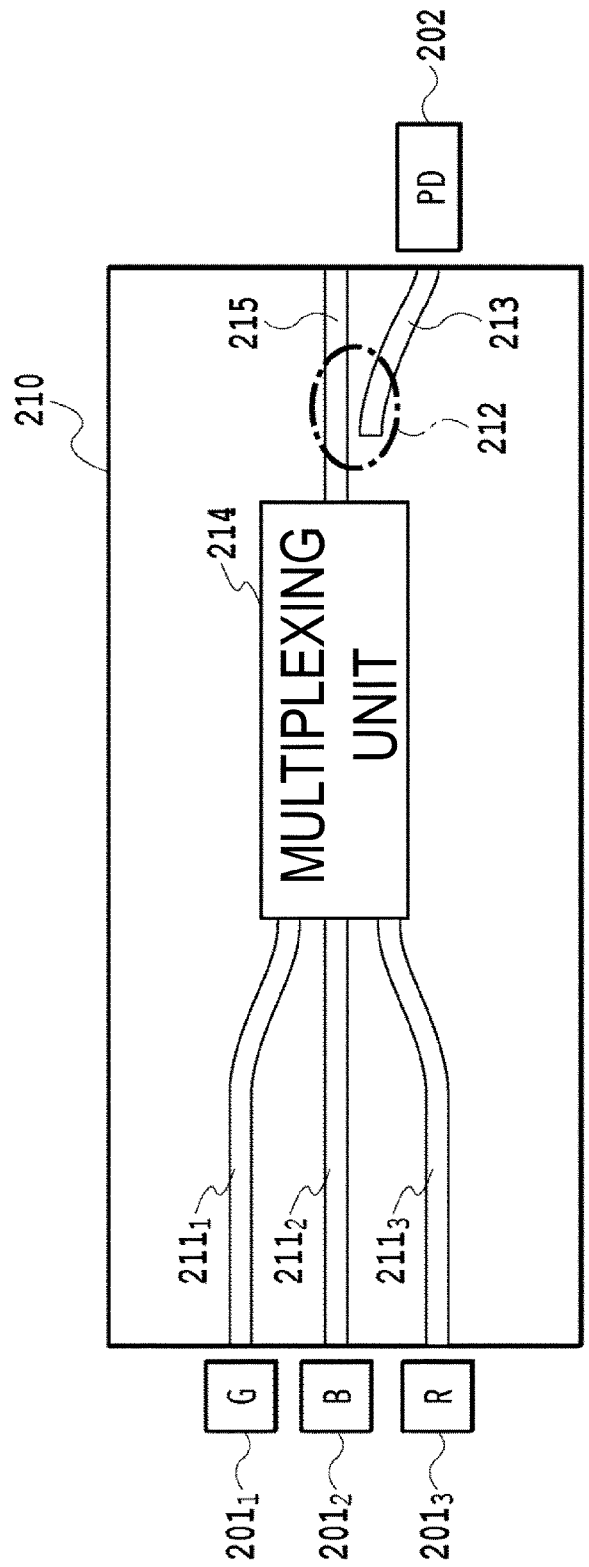
FIG. 6 is a diagram illustrating a light source with a monitoring function according to Example 3 of the first embodiment of the present invention.

FIG. 6 illustrates a light source with a monitoring function according to Example 3 of the first embodiment. A light source 210 with a monitoring function includes first to third LDs $201_1$ to $201_3$ that respectively output light of respective colors of G, B, and R, a PLC-type RGB coupler 210, and a PD 202 optically connected to the RGB coupler 210. A branching unit 212 is provided near an output waveguide 215 in the RGB coupler 210. Multiplexed light propagating through the output waveguide 215 is divided by the branching unit 212 and input to the PD 202.

In Example 3, an output of the output waveguide 215 can be directly monitored, and monitoring can be performed without preparing a circuit for monitoring for each color. Thus, it is possible to realize a smaller light source, and also adjust white balance as a light source by using a monitoring value of the PD 202 by recognizing a multiplexing characteristic of the multiplexing unit 214.

In the first embodiment, even though a light source is described for each one of the colors of R, G, and B, similar monitoring can be performed, even when a light source using an RRGGB coupler is used, by using the PD 202, the branching unit 212, and the monitoring waveguide 213 that are additional.

The branching unit 212 uses a circuit capable of dividing light propagating through a directional coupler and a waveguide such as a Y-branch waveguide. As illustrated in FIGS. 4 to 6, a point where light is divided may be located in any of the input waveguide 211, the multiplexing unit 214, and the output waveguide 215. In any case, an additional bulk component such as a half mirror is not necessary, and a light path inside the PLC need only be added, and the size of a chip rarely increases. Thus, the size of a light source can be reduced.

Second Embodiment

According to Example 1 of the first embodiment, although light of respective colors R, G, and B can be individually monitored, a multiplexing characteristic of the multiplexing unit 214 is not reflected in a monitoring value of the PDs $202_1$ to $202_3$, and thus, as described above, a multiplexing characteristic of the multiplexing unit 214 needs to be recognized in advance. According to Examples 2 and 3 of the first embodiment, there is a problem in that light of respective colors cannot be individually monitored.

Thus, in a second embodiment, a configuration is adopted where light of respective colors and light of a plurality of wavelengths can be individually monitored with high accuracy.

Example 4

Figure 7:
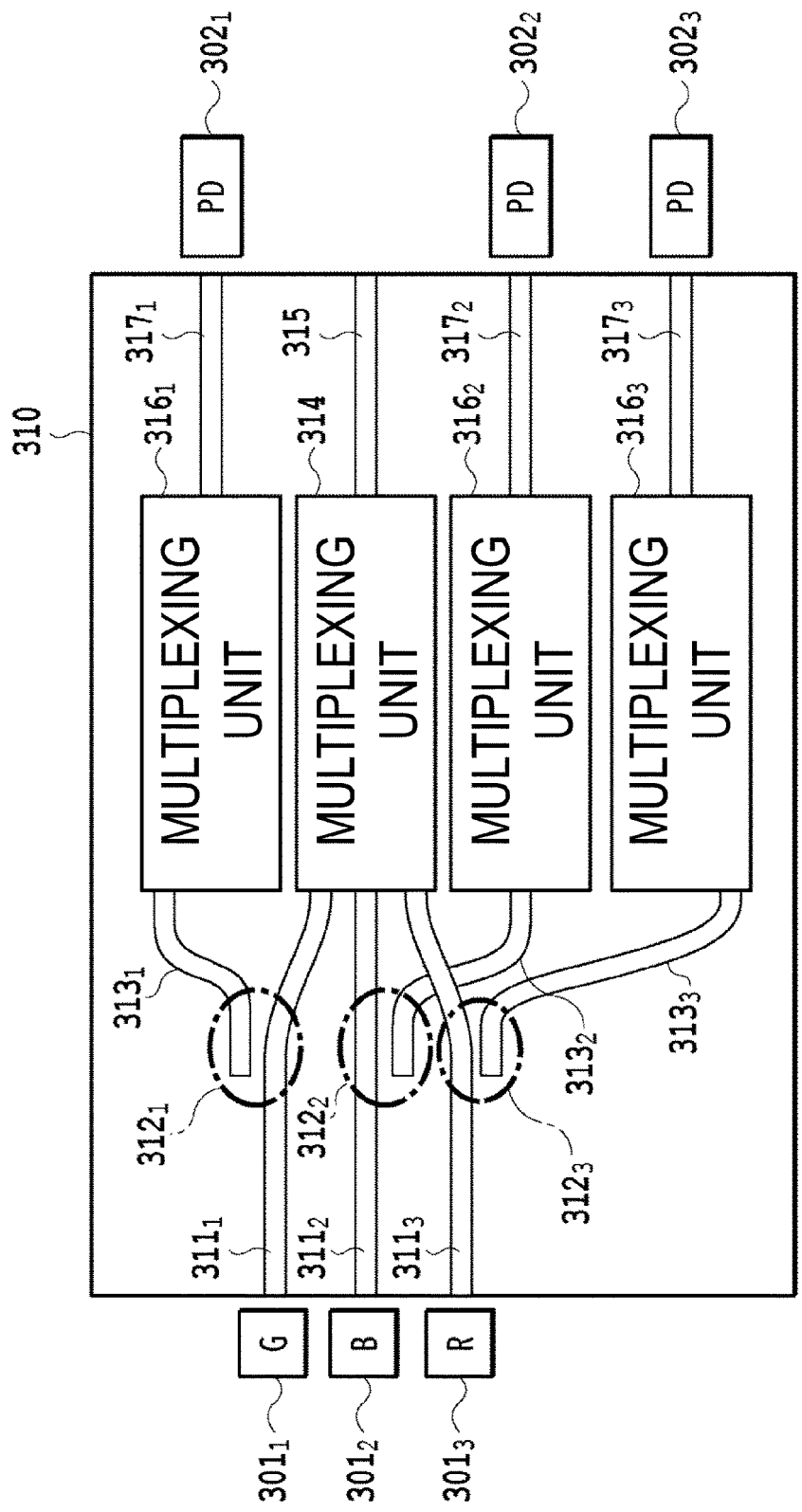
FIG. 7 is a diagram illustrating a light source with a monitoring function according to Example 4 of a second embodiment of the present invention.

FIG. 7 illustrates a light source with a monitoring function according to Example 4 of the second embodiment of the present invention. The light source with a monitoring function includes first to third LDs $301_1$ to $301_3$ that respectively output light of respective colors of R, G, and B, a PLC-type RGB coupler 310, and first to third PDs $302_1$ to $302_3$ optically connected to the RGB coupler 310.

The PLC-type RGB coupler 310 includes first to third input waveguides $311_1$ to $311_3$ optically connected to the first to third LDs $301_1$ to $301_3$, respectively, first to third branching units $312_1$ to $312_3$ that divide light propagating through corresponding ones of the waveguides into two, a multiplexing unit 314 that multiplexes a plurality of first beams of the light, each obtained by dividing the light by a corresponding one of the first to third branching units $312_1$ to $312_3$, and an output waveguide 215 that outputs the light multiplexed by the multiplexing unit 214.

Furthermore, the RGB coupler 310 includes first to third monitoring waveguides $313_1$ to $313_3$ that output a plurality of second beams of the light, each obtained by dividing the light by a corresponding one of the first to third branching units $312_1$ to $312_3$, to corresponding ones of first to third monitoring multiplexing units $316_1$ to $316_3$, and first to third monitoring waveguides $317_1$ to $317_3$ that output an output of the first to third monitoring multiplexing units $316_1$ to $316_3$ to the first to third PDs $302_1$ to $302_3$.

The multiplexing unit 314 and the first to third monitoring multiplexing units $316_1$ to $316_3$ are completely identical optical circuits, and can use the RGB coupler illustrated in FIG. 3. In this case, the first to third input waveguides $311_1$ to $311_3$ are coupled to the first to third input waveguides 101 to 103 illustrated in FIG. 3, respectively, and the output waveguide 315 is coupled to the output waveguide 106 illustrated in FIG. 3. The first monitoring waveguide $313_1$ is the monitoring multiplexing unit $316_1$ and is coupled to the first input waveguide 101 illustrated in FIG. 3, the second monitoring waveguide $313_2$ is the monitoring multiplexing unit $316_2$ and is coupled to the second input waveguide 102 illustrated in FIG. 3, and the third monitoring waveguide $313_3$ is the monitoring multiplexing unit $316_3$ and is coupled to the second input waveguide 103 illustrated in FIG. 3.

With such a configuration, the light of the respective colors of R, G, and B received by the first to third PDs $302_1$ to $302_3$ propagates through and is output from an optical circuit identical to the optical circuit through which each of R, G, and B of the multiplexed light output from the output waveguide 215 propagates. Therefore, monitoring can be performed in consideration of a coupling characteristic of the first to third LDs $301_1$ to $301_3$ and the first to third input waveguides $311_1$ to $311_3$ and a multiplexing characteristic of the multiplexing unit 314. As a result, color control can be performed with high accuracy, and white balance as a light source can also be adjusted with high accuracy.

Since the optical circuits are produced on the same wafer and the same chip, characteristics of the four multiplexing units are considered uniform, and, as in Example 1, it is not necessary to recognize a multiplexing characteristic of the multiplexing unit 214 in advance. Further, since the four multiplexing units are identical optical circuits and can be produced simultaneously in a single process, the manufacturing cost does not increase, and additional components are also not needed.

Example 5

Figure 8:
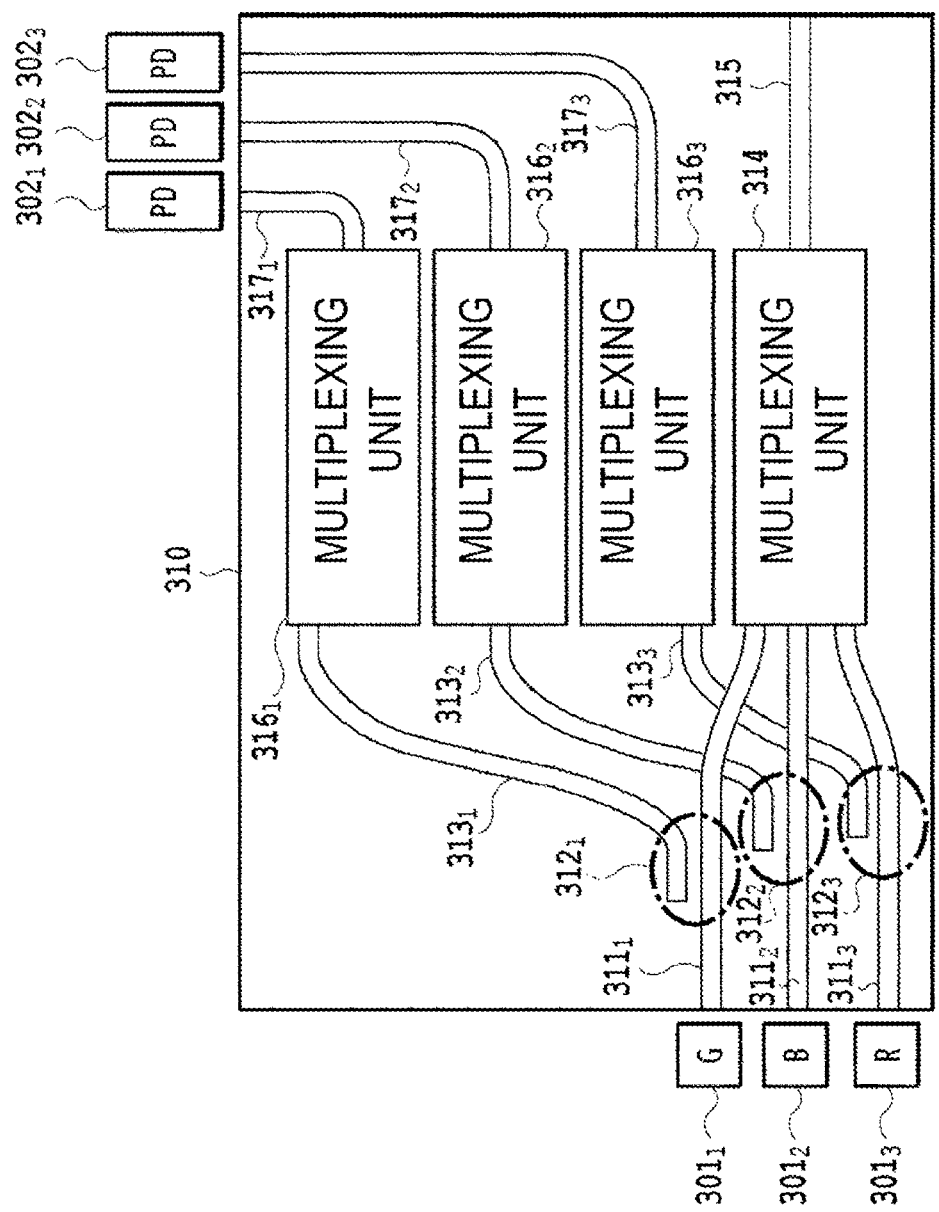
FIG. 8 is a diagram illustrating a light source with a monitoring function according to Example 5 of the second embodiment of the present invention.

FIG. 8 illustrates a light source with a monitoring function according to Example 5 of the second embodiment of the present invention. The configuration of the light source with a monitoring function is the same as that in Example 4, but the arrangement of the first to third monitoring multiplexing units $316_1$ to $316_3$ and the first to third PDs $302_1$ to $302_3$ is different. As illustrated in Examples 1 to 4, when the PDs 202 and 302 are disposed so as to face an emission surface of the LDs 201 and 301, stray light may be incident on the PDs 202 and 302, and an accurate monitoring value may not be taken. Stray light refers to light that leaks into the RGB couplers 210 and 310 when an output of the LDs 201 and 301 cannot be coupled to the input waveguides 211 and 311, light that cannot be multiplexed in the multiplexing units 214, 314, and 316 or leaks, light that leaks into the RGB couplers 210 and 310 via the disposal port of the multiplexing units 214, 314, and 316, and the like.

Thus, in Example 5, the first to third monitoring waveguides $317_1$ to $317_3$ are each a bent waveguide for optical path conversion of 90° such that the LDs 301 and the PDs 302 do not face each other. A configuration is adopted where an emission direction of light from the LDs 301 and an emission direction of light from the multiplexing units 314 and 316 are substantially perpendicular to an incident direction of light in the PDs 302, and thus it is possible to prevent stray light from being incident on the PDs 202 and 302.

The circuit arrangement inside the RGB coupler 310 may be any arrangement as long as a configuration is adopted where an optical axis of the input waveguides 311 and an emission direction of light from the multiplexing units 314 and 316 are substantially perpendicular to an optical axis of the monitoring waveguides 317.

Example 6

Figure 9:
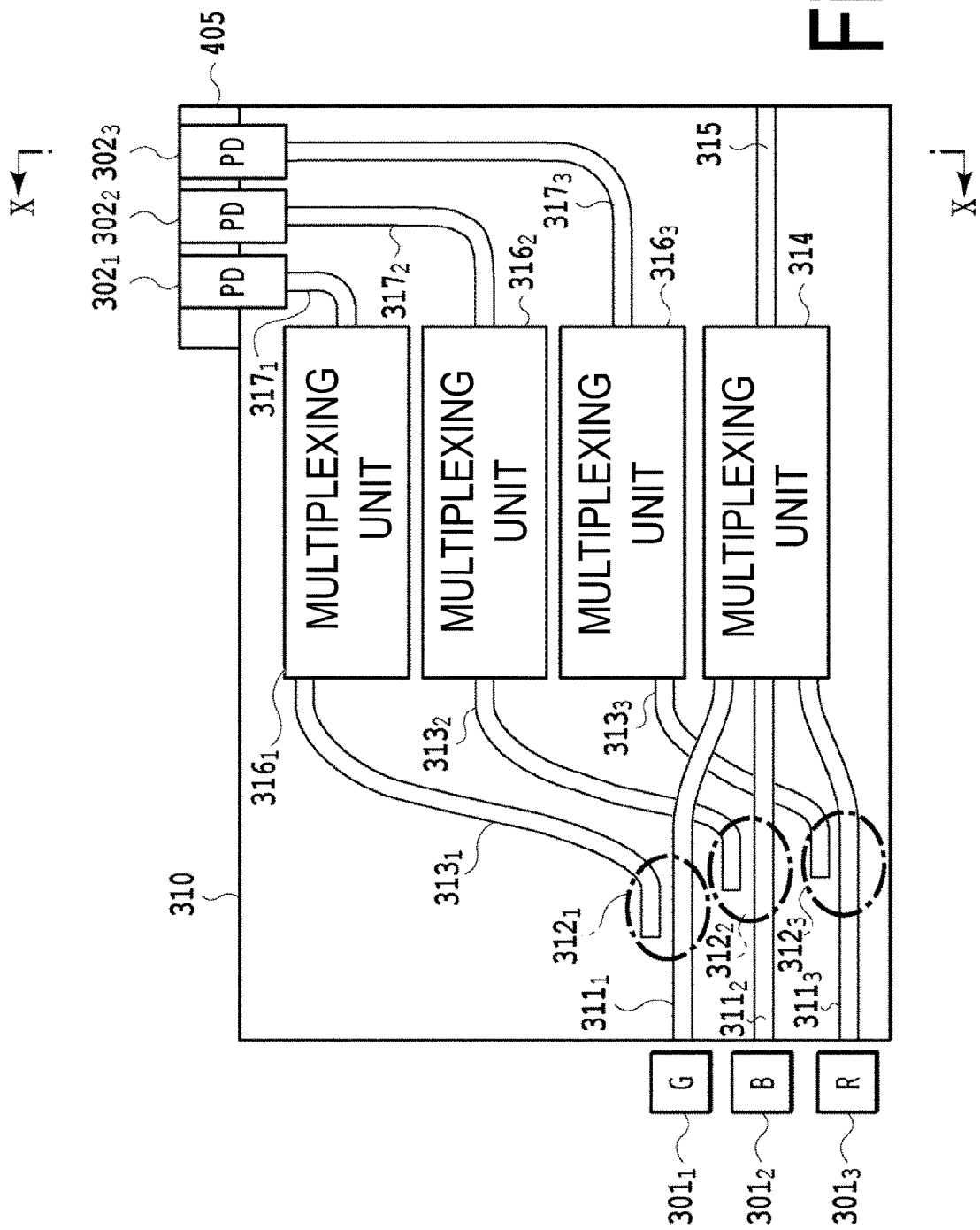
FIG. 9 is a diagram illustrating a light source with a monitoring function according to Example 6 of the second embodiment of the present invention.

FIG. 9 illustrates a light source with a monitoring function according to Example 6 of the second embodiment of the present invention. A configuration of the light source with a monitoring function is the same as that in Example 5, but the method of mounting the first to third PDs $302_1$ to $302_3$ is different.

Figure 10:
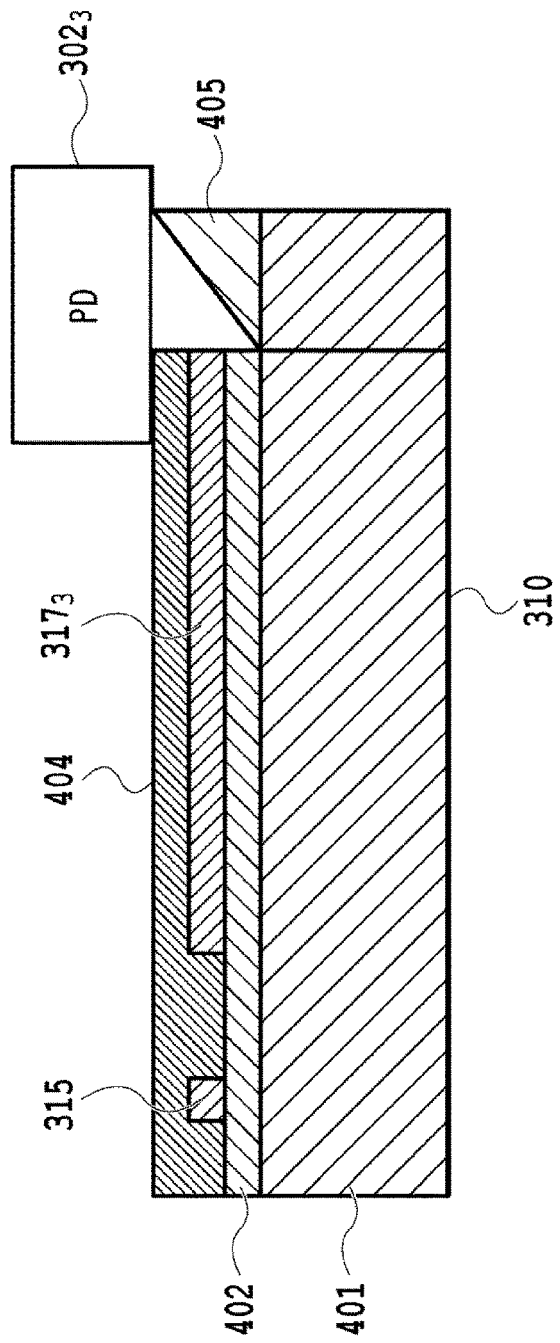
FIG. 10 is a diagram illustrating a method of mounting a PD in Example 6.

FIG. 10 illustrates a method of mounting the PD in Example 6. In the RGB coupler 310, an undercladding layer 402 and a core layer are layered in order on a substrate 401, and an optical circuit such as a waveguide, a branching unit, and a multiplexing unit is formed in the core layer. An overcladding layer 404 is formed so as to cover the optical circuit. FIG. 10 illustrates a cross section of X-X' in FIG. 9.

A flip-up mirror 405 that converts an optical path of incident light by 90° is provided at an emission end of the first to third monitoring waveguides $317_1$ to $317_3$. The first to third PDs $302_1$ to $302_3$ are disposed so as to be optically coupled to the light having the optical path being converted by the flip-up mirror 405.

In Example 6, the PDs 302 are surface-mounted on the RGB coupler 310, and light emitted from the monitoring waveguides 317 is reflected above the substrate by using the flip-up mirror 405 and is incident on the PDs 302. The flip-up mirror 405 is acquired by adhering, to an emission end face of the RGB coupler 310, a substrate having an inclined surface of 45° separately created by using Si or the like. In addition, the flip-up mirror 405 can also be produced by a method of dry-etching a substrate being inclined to 45° and forming an inclined surface of 45° in the middle of the monitoring waveguides 317.

According to Example 6, the PDs 302 can be disposed so as not to face an emission surface of the LDs 301, and thus stray light is less likely to be incident on the PDs 302, and a mounting area of the light source can be reduced. Of course, also, in the light source of Example 4 illustrated in FIG. 7, a similar effect can be obtained by disposing the PDs 302 together with a flip-up mirror.

Example 7

In Examples 4 to 6, the first to third monitoring multiplexing units $316_1$ to $316_3$ are optical circuits identical to the multiplexing unit 314, but a different monitoring multiplexing unit may be applied for each color as follows.

Figure 11:
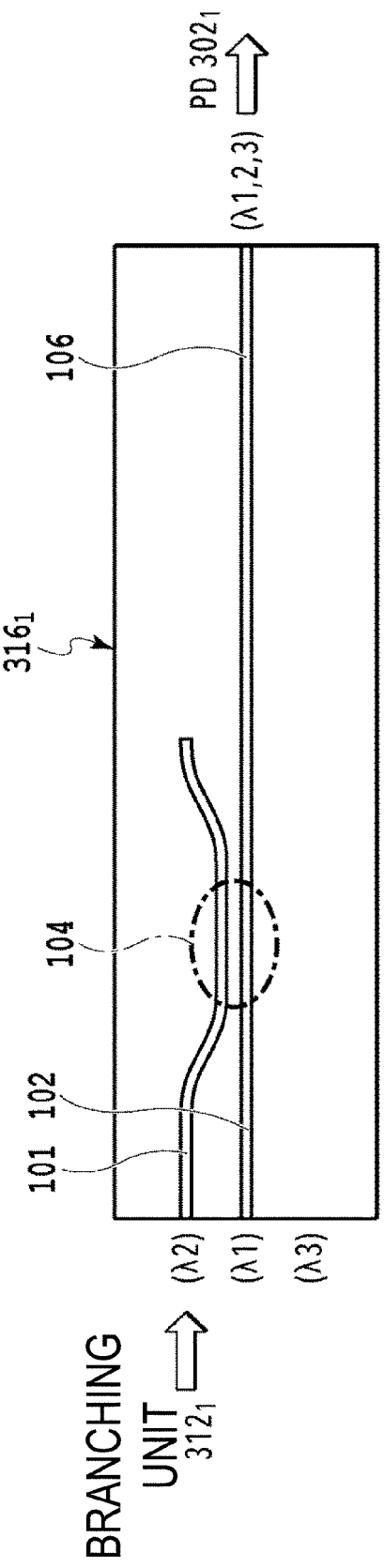
FIG. 11 is a diagram illustrating a monitoring multiplexing unit for green light G in Example 7.

FIG. 11 illustrates a monitoring multiplexing unit for green light G in Example 7. When a propagation characteristic of the green light G (wavelength λ2) is simulated in the RGB coupler using the directional coupler illustrated in FIG. 3, the propagation characteristic is not affected by the waveguide and directional coupler for multiplexing red light R (wavelength λ3). As a result, as illustrated in FIG. 11, the structure of the monitoring multiplexing unit can be simplified.

Figure 12:
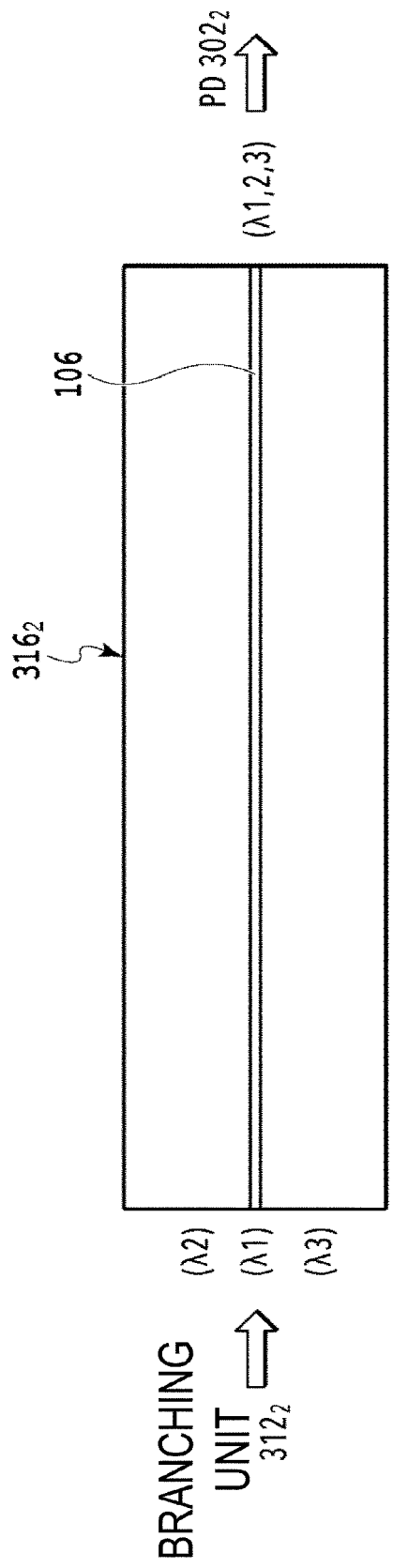
FIG. 12 is a diagram illustrating a monitoring multiplexing unit for blue light B in Example 7.

FIG. 12 illustrates a monitoring multiplexing unit for blue light B in Example 7. When a propagation characteristic of the blue light B (wavelength λ1) is simulated in the RGB coupler using the directional coupler illustrated in FIG. 3, the propagation characteristic is not affected by the waveguide and directional coupler for multiplexing the green light G (wavelength λ2), and the waveguide and directional coupler for multiplexing the red light R (wavelength λ3). As a result, as illustrated in FIG. 12, the structure of the monitoring multiplexing unit can be simplified.

Figure 13:
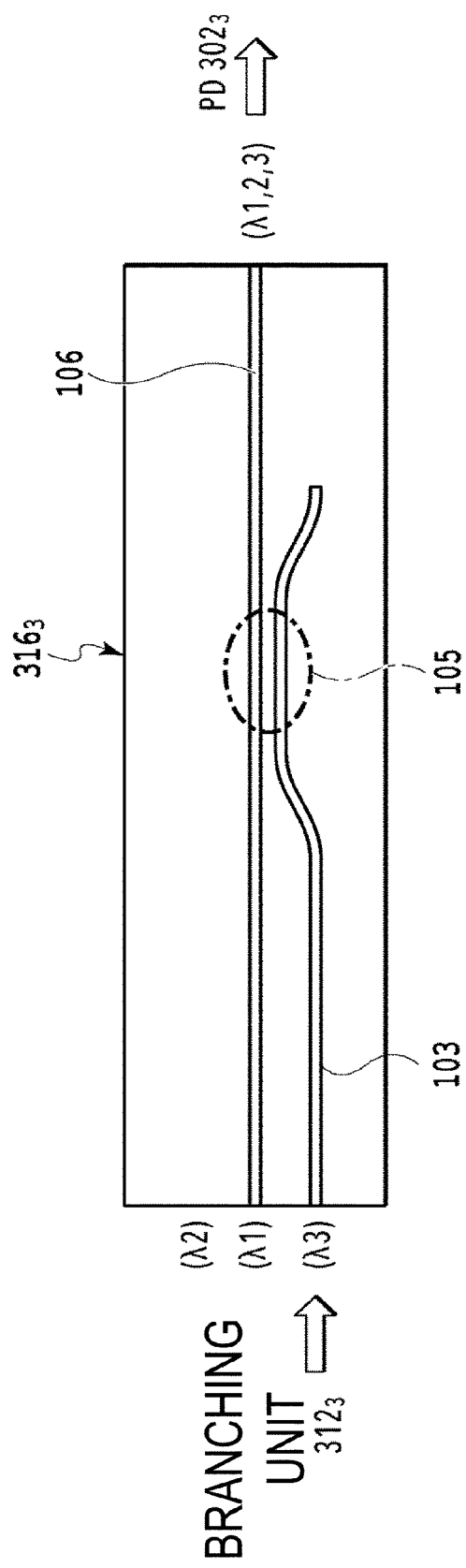
FIG. 13 is a diagram illustrating a monitoring multiplexing unit for red light R in Example 7.

FIG. 13 illustrates a monitoring multiplexing unit for the red light R in Example 7. When a propagation characteristic of the red light R (wavelength λ3) is simulated in the RGB coupler using the directional coupler illustrated in FIG. 3, the propagation characteristic is not affected by the waveguide and directional coupler for multiplexing the green light G (wavelength λ2). As a result, as illustrated in FIG. 13, the structure of the monitoring multiplexing unit can be simplified.

In this way, an optical circuit having the same characteristic as the propagation characteristic when light of respective colors of R, G, and B propagates through the multiplexing unit 314 can be applied as a monitoring multiplexing unit. In Example 7, a simplified structure of the directional coupler illustrated in FIG. 3 is illustrated; however, another circuit type may be used as long as the optical circuit has the same propagation characteristic. Further, the monitoring multiplexing units are each inserted for monitoring the respective colors of R, G, and B. However, for example, the second monitoring multiplexing unit $316_2$ of the blue light B (wavelength λ1) may be omitted, and the monitoring multiplexing units may be inserted for some wavelengths.

Example 8

A light source with a monitoring function normally includes a thermistor. Since an oscillation wavelength of an LD fluctuates due to a change in temperature, feedback control is performed on the LD in accordance with the change in temperature. However, due to mounting restrictions of a package, it may not be possible to dispose a thermistor near an LD, and a measurement may be performed with one thermistor without disposing a thermistor on each individual LD. Therefore, it may not be possible to accurately measure the temperature of each individual LD.

Thus, in Example 8, a configuration is adopted where a change in wavelength due to a change in temperature can be monitored by using a monitoring multiplexing unit as a filter for temperature monitoring. For example, some of the first to third monitoring multiplexing units $316_1$ to $316_3$ in Example 4 illustrated in FIG. 7 are also used as a filter for temperature monitoring.

The filter for temperature monitoring can measure, as a change in light intensity of light received by the PDs 302, a change in oscillation wavelength of the LDs 301 due to a change in temperature. Therefore, the filter for temperature monitoring may be a circuit having a dependence on wavelength to the extent to which a change in the oscillation wavelength of the LDs 301 can be measured as a change in light intensity, and measurement is easy when the circuit has a strong dependence on wavelength. A specific example of a case where a directional coupler is applied as the filter for temperature monitoring will be described.

Figure 14:
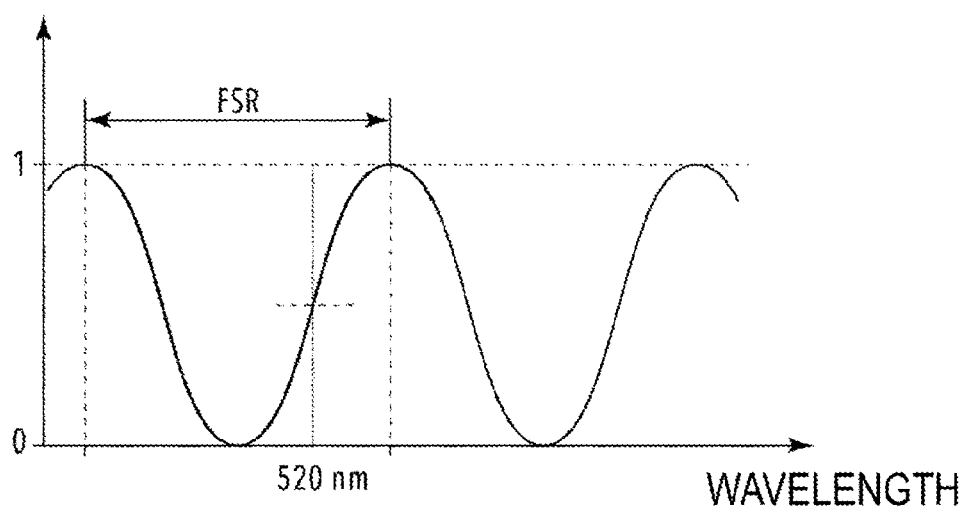
FIG. 14 is a diagram illustrating a dependence of the transmittance of a directional coupler on wavelength.

FIG. 14 illustrates a dependence of the transmittance of a directional coupler on wavelength. The first monitoring multiplexing unit $316_1$ for monitoring green light G (wavelength λ2=520 nm) is illustrated. In the directional coupler illustrated in FIG. 11, a core thickness H of a waveguide=1.75 μm, a specific refractive index difference Δ between waveguides=1.0%, a length L of the directional coupler=222 μm, a width W of the waveguide=1.5 μm, and a gap G between the waveguides=1.0 μm, and FIG. 14 illustrates transmittance when a crossport is an output with respect to an input port. When the first LD $301_1$ has an oscillation wavelength of 520 nm, the transmittance is designed to be 49.6%.

When a directional coupler is used as the filter for temperature monitoring, it is preferable to set the center wavelength of each of the LDs 301 at a point of transmittance of 50% at which a fluctuation of power is the greatest with respect to a change in wavelength. However, since the monitoring multiplexing unit 316 needs to have the same multiplexing characteristic as the multiplexing unit 314, the transmittance is set to 100% at an oscillation wavelength of the LDs 301. Thus, the monitoring multiplexing unit 316 serving as the filter for temperature monitoring sets an FSR so as to monotonically decrease or monotonically increase in a range of an assumed change in wavelength, and sets the transmittance to be 100% near the oscillation wavelength of the LDs 301.

The third monitoring multiplexing unit $316_3$ for monitoring the red light R can also be used as the filter for temperature monitoring by applying the directional coupler illustrated in FIG. 13.

On the other hand, since the second monitoring multiplexing unit $316_2$ for monitoring the blue light B does not have a filter characteristic as illustrated in FIG. 12, the second monitoring multiplexing unit $316_2$ cannot be used as the filter for temperature monitoring.

The invention claimed is:

1. An optical multiplexing circuit, comprising:
   a plurality of branching units configured to each divide light output from a corresponding one of a plurality of input waveguides;
   a multiplexing unit that is configured to multiplex a plurality of first beams of the light, each obtained by dividing the light by a corresponding one of the plurality of branching units;
   an output waveguide that is configured to output the light multiplexed by the multiplexing unit;
   a plurality of monitoring multiplexing units that are optical circuits identical to the multiplexing unit;
   a plurality of first monitoring waveguides that are configured to output a plurality of second beams of the light, each obtained by dividing the light by a corresponding one of the plurality of branching units, to corresponding ones of the plurality of monitoring multiplexing units; and
   a plurality of second monitoring waveguides configured to each output an output of a corresponding one of the plurality of monitoring multiplexing units.

2. The optical multiplexing circuit according to claim 1, wherein the plurality of second monitoring waveguides are each a bent waveguide for optical path conversion, and are each configured such that an optical axis of the plurality of input waveguides and an emission direction of light from the multiplexing unit are substantially perpendicular to an optical axis of the plurality of second monitoring waveguides.

3. A light source with a monitoring operation, comprising:
   the optical multiplexing circuit according to claim 1;
   a plurality of laser diodes optically coupled to a corresponding one of the plurality of input waveguides; and
   a plurality of photodiodes optically coupled to a corresponding one of the plurality of second monitoring waveguides.

4. The light source with a monitoring operation according to claim 3, further comprising:

a flip-up mirror that is provided in a middle of or at an emission end of the plurality of second monitoring waveguides, and converts an optical path of incident light, wherein the plurality of photodiodes are disposed so as to be optically coupled to the light having the optical path being converted by the flip-up mirror.

5. The light source with a monitoring operation according to claim 3, wherein the plurality of laser diodes are three laser diodes that output light of three primary colors of red light (R), green light (G), and blue light (B).

6. A light source with a monitoring operation, comprising:

the optical multiplexing circuit according to claim 2;

a plurality of laser diodes optically coupled to a corresponding one of the plurality of input waveguides; and a plurality of photodiodes optically coupled to a corresponding one of the plurality of second monitoring waveguides.

7. The light source with a monitoring operation according to claim 4, wherein the plurality of laser diodes are three laser diodes that output light of three primary colors of red light (R), green light (G), and blue light (B).

\* \* \* \* \*